(12) United States Patent
Qiu et al.

(10) Patent No.: US 9,407,242 B2
(45) Date of Patent: Aug. 2, 2016

(54) VOLTAGE LEVEL SHIFTER FOR HIGH VOLTAGE APPLICATIONS

(71) Applicant: FREESCALE SEMICONDUCTOR, INC., Austin, TX (US)

(72) Inventors: Liang Qiu, Tinajin (CN); Wenzhong Zhang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/743,828

(22) Filed: Jun. 18, 2015

(65) Prior Publication Data

US 2016/0191027 A1 Jun. 30, 2016

(30) Foreign Application Priority Data

Dec. 26, 2014 (CN) .......................... 2014 1 0858363

(51) Int. Cl.
  *H03K 3/00* (2006.01)
  *H03K 3/356* (2006.01)

(52) U.S. Cl.
  CPC ..................................... *H03K 3/356* (2013.01)

(58) Field of Classification Search
  None
  See application file for complete search history.

(56) References Cited

U.S. PATENT DOCUMENTS

| | | | |
|---|---|---|---|
| 6,057,726 A * | 5/2000 | Sumida | H03K 17/063 327/333 |
| 6,428,683 B1 | 8/2002 | Jaworowski et al. | |
| 6,429,683 B1 | 8/2002 | Miller et al. | |
| 6,650,168 B1 | 11/2003 | Wang et al. | |
| 6,683,505 B2 | 1/2004 | West | |
| 6,954,100 B2 | 10/2005 | Dharne et al. | |
| 7,009,424 B2 | 3/2006 | Khan et al. | |
| 7,053,657 B1 | 5/2006 | Peng | |
| 7,053,722 B2 | 5/2006 | Rein et al. | |
| 7,061,299 B2 | 6/2006 | Khan et al. | |
| 7,102,410 B2 | 9/2006 | Khan et al. | |
| 7,157,970 B2 | 1/2007 | Dawes | |
| 7,187,205 B2 | 3/2007 | Ramaraju et al. | |
| 7,382,158 B2 | 6/2008 | Kimura | |
| 7,397,297 B2 | 7/2008 | Kimura | |
| 7,443,223 B2 | 10/2008 | Bajkowski et al. | |
| 7,446,566 B1 | 11/2008 | Chrudimsky | |
| 7,489,205 B2 | 2/2009 | Chatterjee et al. | |
| 7,501,876 B2 | 3/2009 | Kimura | |
| 7,548,093 B1 | 6/2009 | Priel et al. | |
| 7,560,970 B2 | 7/2009 | Cook et al. | |
| 7,671,629 B2 | 3/2010 | Zhang et al. | |
| 7,683,668 B1 | 3/2010 | Thakur et al. | |
| 7,750,717 B2 | 7/2010 | Ali et al. | |
| 7,764,123 B2 | 7/2010 | Kimura | |
| 7,777,522 B2 | 8/2010 | Yang et al. | |
| 7,791,422 B2 | 9/2010 | Lu et al. | |
| 7,808,286 B1 | 10/2010 | Miller et al. | |

(Continued)

*Primary Examiner* — Long Nguyen
(74) *Attorney, Agent, or Firm* — Charles E. Bergere

(57) ABSTRACT

A voltage level shifter for high voltage applications has a low voltage domain current mirror having first and second branches. A high voltage switch and a resistor are connected in series with the second branch. An output stage provides an output signal that is a function of a voltage difference across the resistor, and the output stage and the resistor are in the high voltage domain. Assertion of an input signal in the low voltage domain develops a first current in the first branch, and causes the high voltage switch to pass in the resistor a second current from the second branch that is a function of the first current and develops the voltage difference across the resistor. Only the high voltage switch needs to have high breakdown voltage characteristics.

18 Claims, 3 Drawing Sheets

(56) References Cited

U.S. PATENT DOCUMENTS

| | | |
|---|---|---|
| 7,816,948 B1 | 10/2010 | Sanchez |
| 7,902,870 B1 | 3/2011 | Jiang |
| 7,956,662 B2 | 6/2011 | Arora et al. |
| 7,965,145 B2 | 6/2011 | Kim et al. |
| 7,994,819 B2 | 8/2011 | Al-Shyoukh et al. |
| 8,093,938 B2 | 1/2012 | Duby et al. |
| 8,198,916 B2 | 6/2012 | Sood et al. |
| 8,258,848 B2 | 9/2012 | Chen |
| 8,350,592 B1 | 1/2013 | Malhan et al. |
| 8,378,728 B1 | 2/2013 | Goyal et al. |
| 8,432,189 B1 | 4/2013 | Malhan et al. |
| 8,436,671 B2 | 5/2013 | Chern et al. |
| 8,497,726 B2 | 7/2013 | Ryu et al. |
| 8,598,916 B2 | 12/2013 | Miller et al. |
| 8,643,425 B2 | 2/2014 | Chaudhry et al. |
| 8,664,997 B2 * | 3/2014 | Ji .................. H03K 17/145 327/333 |
| 8,686,784 B2 | 4/2014 | Wang |
| 8,723,582 B1 | 5/2014 | Goyal et al. |
| 8,816,748 B2 | 8/2014 | Kumar et al. |

* cited by examiner

VOLTAGE LEVEL SHIFTER FOR HIGH VOLTAGE APPLICATIONS

BACKGROUND OF THE INVENTION

The present invention is directed to integrated circuits and, more particularly, to a voltage level shifter.

Complex semiconductor integrated circuits (ICs) often have logic circuits and/or signal and data processors formed of transistors, such as metal-oxide field-effect transistors (MOSFETs) that have a fast operating speed and occupy a small area of the semiconductor die. However, such transistors have a limited breakdown voltage, the maximum voltage that the transistors can withstand without breaking down, particularly the voltage difference that can be applied across the gate insulator of a MOSFET and its source (or drain).

It is possible to include in a single IC die both transistors with small feature size and low breakdown voltages in a low voltage domain and transistors with higher breakdown voltages in a high voltage domain, provided that the low breakdown voltage transistors are not exposed to voltages of the high voltage domain. The high voltage domain is often floating, that is to say that the two voltage domains do not have a common power supply voltage. A voltage level shifter typically receives an input signal from a low voltage domain and transfers the signal to a high voltage domain. Applications for a voltage level shifter include a brushless direct current (DC) motor driver, and a DC-DC voltage converter, for example.

A voltage level shifter is exposed to both the low and high voltage domains. Transistors of the level shifter that are exposed to high voltage difference need high breakdown voltage characteristics. However the precautions taken to protect a high voltage transistor from breakdown greatly increase the die area occupied, especially for ultra-high voltage (UHV) MOSFETs capable of withstanding breakdown voltages of 5V or more. Therefore, it is desirable to reduce the number of high breakdown voltage transistors in a voltage level shifter.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
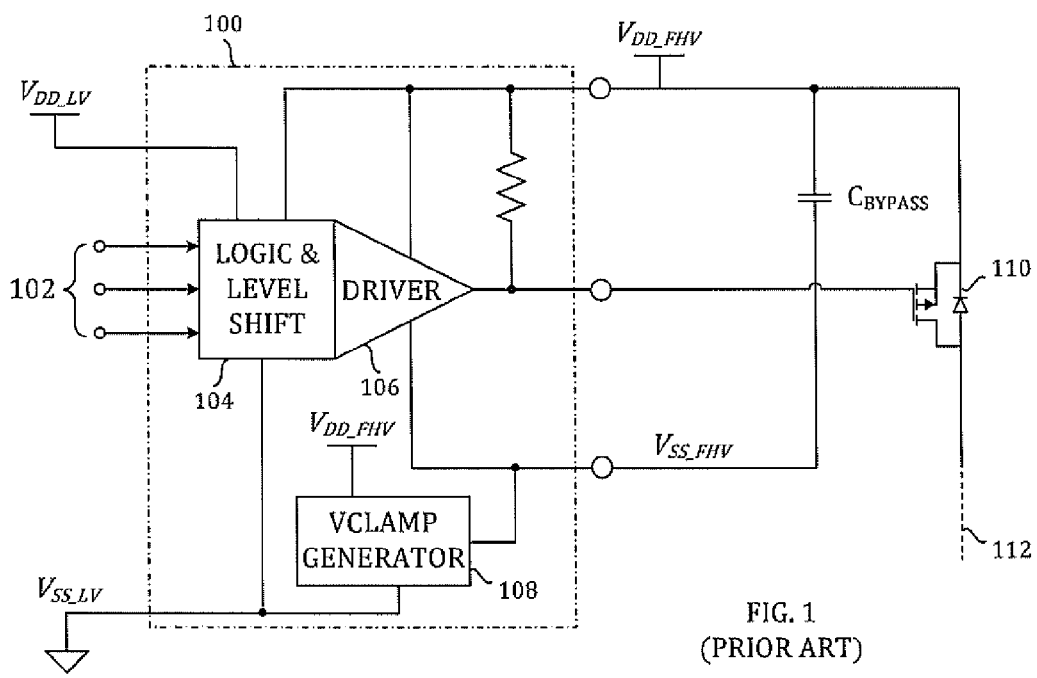
FIG. 1 is a schematic block diagram of a brushless direct current (DC) motor driver including a conventional voltage level shifter.

FIG. 1 illustrates a brushless direct current (DC) motor driver including a conventional voltage level shifter. A first semiconductor die 100 has low voltage power supply rails at voltages $V_{DD\_LV}$ and $V_{SS\_LV}$ and signal input terminals 102 in a low voltage domain. A logic and level shift module 104 processes input signals at the input terminals 102 and provides corresponding signals in a floating high voltage domain to a buffer amplifier 106 acting as pre-driver for the motor control. The floating high voltage domain is supplied with power on rails at voltages $V_{DD\_FHV}$, from a power supply (not shown), and $V_{SS\_FHV}$. The voltage $V_{SS\_FHV}$ is defined by a voltage clamp generator supplied with power from the rail $V_{SS\_LV}$ and the rail $V_{DD\_FHV}$. The range of float of $V_{DD\_FHV}$ can be as large as 5V to 30V, for example, while the low voltage domain can be supplied at 1.8V in this example.

Elements in the floating high voltage domain are supplied with power from the rails $V_{DD\_FHV}$ and $V_{SS\_FHV}$ and include a power MOSFET 110. The MOSFET 110 receives the drive signal in the high voltage domain from the buffer 106 at a gate electrode to control the supply of drive current to the motor on an output terminal 112.

Figure 2:
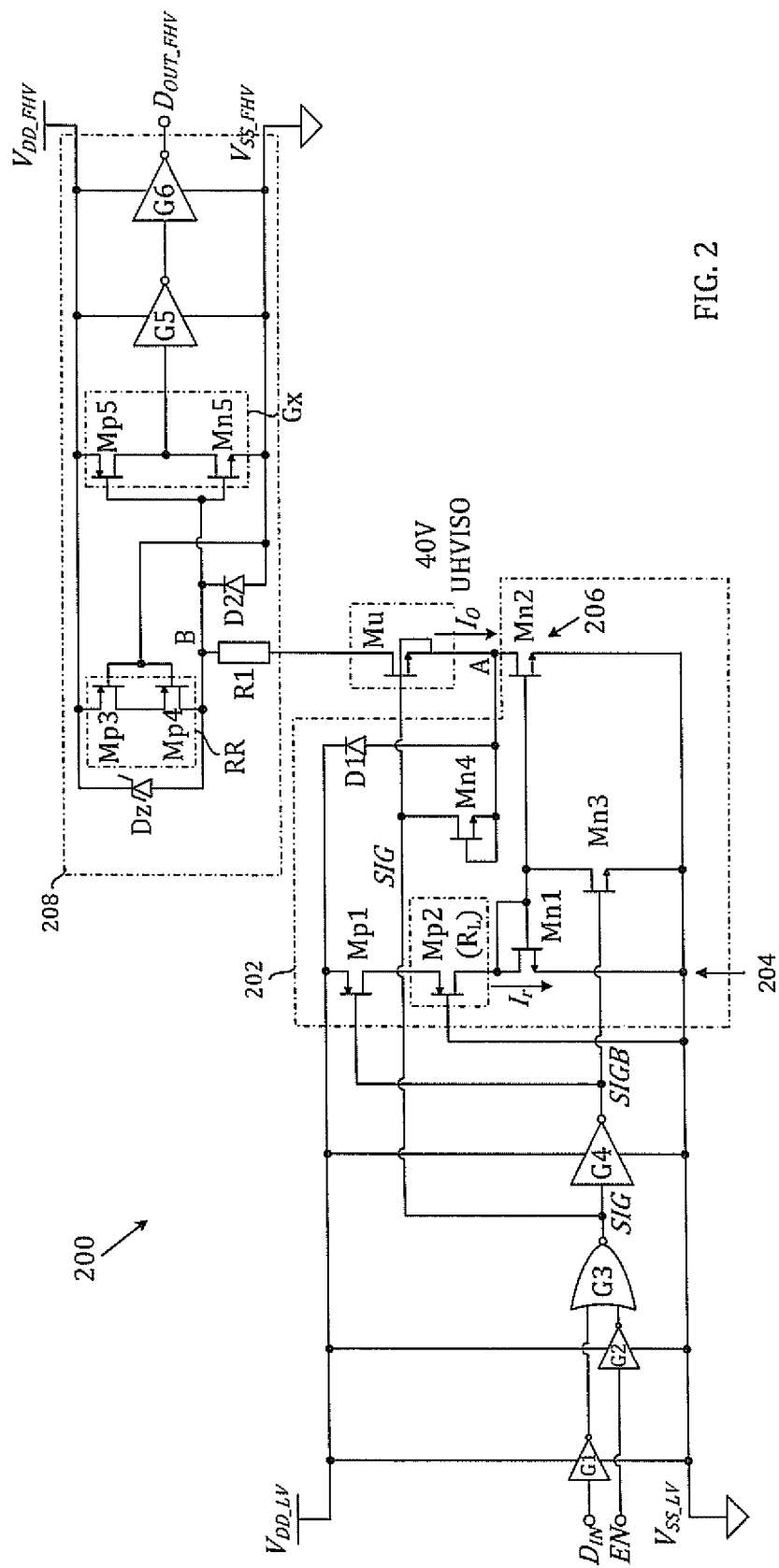
FIG. 2 is a simplified circuit diagram of a voltage level shifter in accordance with an embodiment of the present invention, given by way of example.
Figure 3:
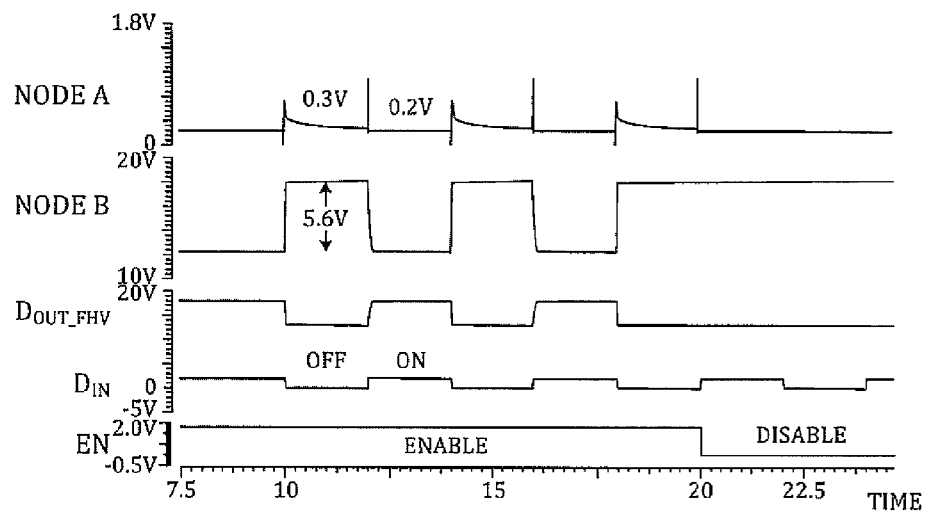
FIGS. 3 to 6 are graphs of voltages appearing in operation of examples of the implementation of the voltage level shifter of FIG. 3.
Figure 4:
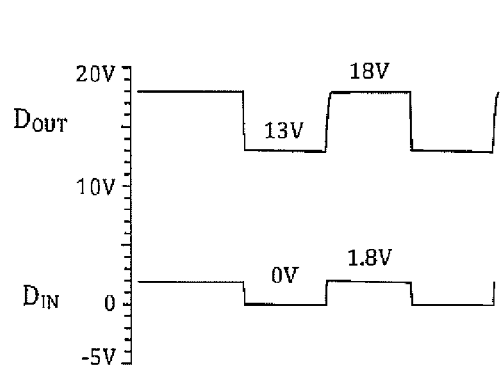
Figure 5:
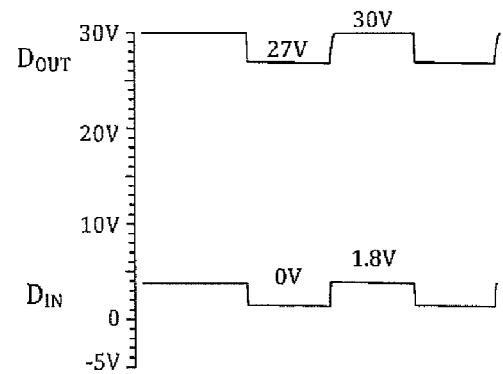
Figure 6:
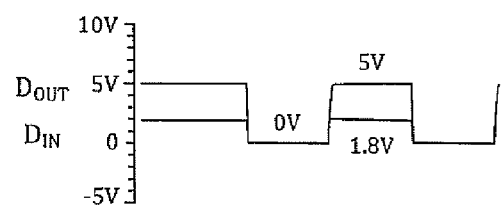

FIG. 2 illustrates a voltage level shifter 200 in accordance with an embodiment of the present invention, given by way of example. The voltage level shifter 200 comprises a low voltage domain current mirror 202 including first and second branches 204 and 206. A high voltage switch Mu and a resistor RR are connected in series with the second branch 206. An output stage 208 provides an output signal $D_{OUT\_FHV}$ that is a function of a voltage difference ΔV across the resistor RR. The output stage 208 and the resistor RR are in the high voltage domain. Assertion of an input signal SIG in the low voltage domain generates a first current $I_r$ in the first branch 204, and causes the high voltage switch Mu to pass in the resistor RR a second current $I_O$ from the second branch 206 that is a function of the first current $I_r$ and that generates the voltage difference ΔV across the resistor RR.

With the above-described circuit architecture, only a single element, the high voltage switch Mu, needs to have high breakdown voltage characteristics. The elements of the current mirror 202 are in the low voltage domain, are not exposed to the high voltage domain, and can be low breakdown voltage elements. In particular, when the high voltage switch Mu conducts, it cannot apply a greater voltage difference to the second branch 206 than the input signal SIG in the low voltage domain. The output stage 208 is in the high voltage domain but is not exposed to high voltage differences, and can also have low breakdown voltage elements. Only the high voltage switch Mu and the resistor RR are exposed to the voltage differences between the high and low voltage domains. The resistor RR can have a high resistance so that when the high voltage switch Mu conducts, only a weak current $I_O$ flows in the resistor RR, which does not impose high breakdown voltage characteristics. When the high voltage switch Mu is OFF, it holds the difference between the high and low voltage domains and the node B between the high voltage switch Mu and the resistor RR is pulled up into the high voltage domain, so that no voltage difference appears any more across the resistor RR.

The current mirror 202 can be self-biasing and does not need further elements to provide bias voltage.

A low voltage switch Mp1 may be connected in series with the first branch 204 and passes the first current $I_r$ when the input signal SIG is asserted. When the input signal SIG is de-asserted, both branches 204 and 206 of the current mirror 202 are switched off, reducing current consumption.

De-assertion of the input signal SIG halts flow of the first and second currents $I_r$ and $I_O$ and the high voltage switch Mu withstands a voltage difference $(V_{DD\_FHV}-V_{SS\_LV})$ between the high and low voltage domains.

The first and second branches 204 and 206 of the current mirror 202 may have first and second transistors Mn1 and Mn2 respectively, which have respective control electrodes connected together and first and second current carrying paths respectively. The first branch 204 may include in series a first resistor RL, the first current carrying path and a low voltage switch Mp1. Assertion of the input signal SIG in the low voltage domain causes the low voltage switch Mp1 to apply a voltage difference across the first resistor RL and the first transistor Mn1, which generates the first current $I_r$ in the first branch, and causes the high voltage switch Mu to pass in the second resistor RR a second current $I_O$ from the second branch 206. The second current $I_O$ is a function of the first current $I_r$ and generates the voltage difference $\Delta V$ across the second resistor RR.

A unidirectional element D1 in the low voltage domain may be connected to a node A between the high voltage switch Mu and the second branch 206, and a resistor R1 connected between the high voltage switch Mu and a node B in the high voltage domain, to conduct electrostatic discharge (ESD) currents from the high voltage domain and protect the high voltage switch Mu.

The first resistor RL may comprise a current carrying path of a transistor Mp2. The second resistor RR may comprise current carrying paths of a plurality of series connected transistors Mp3 and Mp4. This configuration enables the voltage difference $\Delta V$ to be obtained with a smaller value of the current $I_O$ from the second branch 206.

A Zener diode Dz is connected in parallel with the second resistor RR to clamp the voltage difference $\Delta V$ across the second resistor RR to a limit value.

The output stage 208 may include an asymmetrical push-pull inverter Gx. The asymmetry of the inverter Gx can ensure a reliable toggle of the output signal $D_{OUT\_FHV}$ by its high threshold voltage.

A unidirectional element Mn4 in the low voltage domain may be connected to the node A between the high voltage switch Mu and the second branch 206 to prevent voltage difference appearing across the second branch 206 when the input signal SIG is de-asserted and the high voltage switch Mu is non-conductive.

Another unidirectional element D2 in the high voltage domain may be connected to a node B between the high voltage switch Mu and the second resistor RR to conduct electrostatic discharge (ESD) currents from the high voltage domain and protect the output stage 208.

In more detail, inverters G1 and G2 in the low voltage domain receive respectively a data input signal $D_{IN}$ and an enable signal EN. The outputs of the inverters G1 and G2 are connected to respective inputs of a NOR gate G3, whose output is asserted when both the signals $D_{IN}$ and EN are asserted, and forms the input signal SIG. An inverter G4 receives the input signal SIG and provides its complement SIGB at its output. The inverters G1, G2 and G4 and the gate G3 are located in the low voltage domain.

The current mirror 202, the high voltage switch Mu and the resistors RL and RR comprise MOSFETs. The branches 204 and 206 of the current mirror 202 have n-type MOSFETs Mn1 and Mn2, whose gates are connected together and to the drain of the MOSFET Mn1, and their sources are connected to ground $V_{SS\_LV}$ of the low voltage domain. The drain of the MOSFET Mn1 is connected to the drain of a p-type MOSFET Mp2, which forms the resistor RL, and whose gate is connected to ground $V_{SS\_LV}$. The source of the MOSFET Mp2 is connected to the drain of a p-type MOSFET Mp1 forming the low voltage switch for the first branch 204 of the current mirror 202. The source of the MOSFET Mp1 is connected to the voltage supply rail $V_{DD\_LV}$ of the low voltage domain and its gate is connected to receive the complement SIGB of the input signal SIG from the inverter G4. De-assertion of SIGB signal pulls down the gate of the MOSFET Mp1 and turns it on. The MOSFET Mp2 pulls up the gates of the MOSFETs Mn1 and Mn2, and the MOSFET Mn1 conducts the current $I_r$ defined by the drain-source resistances in series of the MOSFET Mn1 and the MOSFET Mp2 (resistor RL).

An n-type MOSFET Mn3 has its drain connected to the gates of the MOSFETs Mn1 and Mn2 in the current mirror 202 and its source connected to ground $V_{SS\_LV}$ of the low voltage domain. The gate of the MOSFET Mn3 is connected to the output of the inverter G4. When the signal SIGB is asserted (and the input signal SIG is de-asserted), the MOSFET Mn3 conducts to pull down the gates of the MOSFETs Mn1 and Mn2 and turn them off, reducing leakage current. When the signal SIGB is de-asserted (and the input signal SIG is asserted), the MOSFET Mn3 is non-conductive, enabling the MOSFET Mp2 to pull up the gates of the MOSFETs Mn1 and Mn2. The MOSFET Mn2 conducts the current $I_O$, which is proportional to the current $I_r$, in the ratio of the sizes of the MOSFETs Mn1 and Mn2.

The node A between the drain of the MOSFET Mn2 and the source of the MOSFET Mu is connected to the anode of a diode D1, whose cathode is connected to the voltage supply rail $V_{DD\_LV}$ of the low voltage domain. The diode D1 is a unidirectional element that conducts if the voltage of node A rises above the voltage of the supply rail $V_{DD\_LV}$ in order to protect the gate oxide of the MOSFET Mu from exposure to voltages exceeding its breakdown voltage if an ESD pulse pulls up its drain.

An n-type MOSFET Mn4 has its gate connected to its source and to node A. The drain of the MOSFET Mn4 is connected to the output of the NOR gate G3. When the input signal SIG is de-asserted and the current mirror 202 and the MOSFET Mu are non-conductive, the MOSFET Mn4 forms a unidirectional element and pulls the voltage at node A down to prevent voltage difference appearing across the second branch 206 and to protect the source-drain path of the MOSFET Mn2.

The output stage 208 includes an asymmetrical push-pull inverter Gx having a p-type MOSFET Mp5 whose source is connected to the voltage supply rail $V_{DD\_FHV}$ of the floating high voltage domain and whose drain is connected to the drain of an n-type MOSFET Mn5, whose source is connected to the ground $V_{SS\_FHV}$ of the floating high voltage domain. The gates of the MOSFETS Mp5 and Mn5 are connected to the node B. The drains of the MOSFETS Mp5 and Mn5 are connected through two inverters G5 and G6 in series to supply the output signal $D_{OUT\_FHV}$. The MOSFETS Mp5 and Mn5 have different sizes chosen to ensure a reliable toggle of the output of the inverter Gx by its high threshold voltage.

The MOSFETs of the current mirror 202 and other MOSFETs in the low voltage domain, and the MOSFETs in the output stage 208 can all have low breakdown voltage characteristics, since they are not exposed to high differences of voltage. Only the high voltage switch formed by the MOSFET Mu needs high breakdown voltage characteristics. In this example the MOSFET Mu has an ultra-high voltage MOSFET configuration, capable of withstanding up to 40V across its drain and source when non-conductive. No specific input bias current or voltage bias is needed for the level shifter 200, and the level shifter 200 can be integrated in a system-on-chip (SoC) as a standard cell.

The node B between the drain of the MOSFET Mu and the second resistor RR (MOSFETs Mp3 and Mp4) is connected to the cathode of a diode D2, whose anode is connected to the ground $V_{SS\_FHV}$ of the floating high voltage domain. The diode D2 is a unidirectional element that conducts if the voltage of the node B falls below the voltage of the ground $V_{SS\_FHV}$ in order to protect the gate oxide of the MOSFETs Mp5 and Mn5 from exposure to voltage differences exceeding their breakdown voltage.

FIGS. 3 to 6 illustrate examples of voltages appearing in the level shifter 200 as a function of time. The different values of voltage can be obtained by adjusting the resistances of RL and RR and the relative sizes of the MOSFETs Mn1 and Mn2 of the current mirror 202. In all cases, the data input signal $D_{IN}$ and the enable signal EN vary between 1.8V and 0V. In the case illustrated in FIGS. 3 and 4, the voltage at node A varies between 0.2V and 0.3V, with low voltage excursions during switching. The voltage at node B and of the output signal $D_{OUT\_FHV}$ vary by 5.6V between approximately 13V and 18V. In the case illustrated in FIG. 5, the output signal $D_{OUT\_FHV}$ varies between approximately 27V and 30V. In the case illustrated in FIG. 6, the output signal $D_{OUT\_FHV}$ varies between approximately 0V and 5V.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is low active where the logically true state corresponds to a logic level zero. In the case of a positive logic signal, the signal is high active where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The Abstract is provided with the understanding that it will not be used for claim construction.

The invention claimed is:

1. A voltage level shifter, comprising:
a low voltage domain current mirror including first and second branches;
a high voltage switch and a first resistor connected in series with the second branch;
an output stage that provides an output signal that is a function of a voltage difference across the first resistor, wherein the output stage and the first resistor are in a high voltage domain; and
a first unidirectional element in the low voltage domain that prevents a voltage difference appearing across the second branch when the high voltage switch is non-conducting,
wherein assertion of an input signal in the low voltage domain generates a first current in the first branch, and causes the high voltage switch to pass in the resistor a second current from the second branch that is a function of the first current and that generates the voltage difference across the resistor, and de-assertion of the input signal halts flow of the first and second currents, and the high voltage switch withstands a voltage difference between the high and low voltage domains.

2. The voltage level shifter of claim 1, further comprising a low voltage switch connected in series with the first branch for passing the first current when the input signal is asserted.

3. The voltage level shifter of claim 1, wherein the first unidirectional element is connected to a node between the high voltage switch and the second branch, and a second resistor is connected between the high voltage switch and a node in the high voltage domain, to conduct electrostatic discharge (ESD) currents from the high voltage domain and protect the high voltage switch.

4. The voltage level shifter of claim 1, wherein the first resistor includes current carrying paths of a plurality of series connected transistors.

5. The voltage level shifter of claim 1, wherein the first unidirectional element comprises a Zener diode connected in parallel with the first resistor to clamp the voltage difference across the first resistor to a limit value.

6. The voltage level shifter of claim 1, wherein the output stage includes an asymmetrical push-pull inverter.

7. The voltage level shifter of claim 1, further comprising a second unidirectional element in the high voltage domain connected to a node between the high voltage switch and the first resistor to conduct electrostatic discharge (ESD) currents from the high voltage domain and protect the output stage.

8. A voltage level shifter, comprising:
a low voltage domain current mirror including first and second branches having first and second transistors respectively that have respective control electrodes connected together and first and second current carrying paths respectively, the first branch including in series a first resistor, the first current carrying path and a low voltage switch;
a high voltage switch and a second resistor in series with the second branch; and
an output stage that provides an output signal that is a function of a voltage difference across the second resistor, wherein the output stage and the second resistor are in the high voltage domain;
wherein assertion of an input signal in the low voltage domain causes the low voltage switch to apply a voltage difference across the first resistor and the first transistor that generates a first current in the first branch, and causes the high voltage switch to pass in the second resistor a second current from the second branch that is a function of the first current and that generates the voltage difference across the second resistor.

9. The voltage level shifter of claim 8, wherein the low voltage switch passes the first current when the input signal is asserted.

10. The voltage level shifter of claim 8, wherein de-assertion of the input signal halts flow of the first and second currents and the high voltage switch withstands a voltage difference between the high and low voltage domains.

11. The voltage level shifter of claim 10, further comprising a unidirectional element in the low voltage domain connected to a node between the high voltage switch and the second branch to prevent a voltage difference appearing across the second branch when the input signal is de-asserted and the high voltage switch is non-conductive.

12. The voltage level shifter of claim 10, further comprising a unidirectional element in the low voltage domain connected to a node between the high voltage switch and the second branch, and a third resistor connected between the high voltage switch and a node in the high voltage domain, to conduct electrostatic discharge (ESD) currents from the high voltage domain and protect the high voltage switch.

13. The voltage level shifter of claim 8, further comprising a Zener diode connected in parallel with the second resistor for clamping the voltage difference across the second resistor to a limit value.

14. The voltage level shifter of claim 8, wherein the output stage includes an asymmetrical push-pull inverter.

15. The voltage level shifter of claim 8, further comprising a unidirectional element in the high voltage domain connected to a node between the high voltage switch and the second resistor to conduct electrostatic discharge (ESD) currents from the high voltage domain and protect the output stage.

16. A voltage level shifter, comprising:
a low voltage domain current mirror including first and second branches;
a high voltage switch and a first resistor connected in series with the second branch;
a first unidirectional element in the low voltage domain connected across the second branch;
a second unidirectional element in the low voltage domain connected to a node between the high voltage switch and the second branch, and a second resistor connected between the high voltage switch and a node in the high voltage domain, to conduct electrostatic discharge (ESD) currents from the high voltage domain and protect the high voltage switch; and
an output stage providing an output signal that is a function of a voltage difference across the first resistor, the output stage and the first resistor being in the high voltage domain;
wherein assertion of an input signal in the low voltage domain generates a first current in the first branch, and causes the high voltage switch to pass in the resistor a second current from the second branch that is a function of the first current and that generates the voltage difference across the first resistor; and
wherein the first unidirectional element prevents voltage difference appearing across the second branch when the high voltage switch is non-conducting.

17. The voltage level shifter of claim 16, further comprising a low voltage switch connected in series with the first branch that passes the first current when the input signal is asserted.

18. The voltage level shifter of claim 16, wherein de-assertion of the input signal halts flow of the first and second currents and the high voltage switch withstands a voltage difference between the high and low voltage domains.

* * * * *